United States Patent
Ku

(10) Patent No.: US 9,647,798 B2
(45) Date of Patent: May 9, 2017

(54) DECODING METHOD USING DYNAMIC SCALER FACTOR

(71) Applicant: MStar Semiconductor, Inc., Hsinchu Hsien (TW)

(72) Inventor: Yu-Hsien Ku, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/195,053

(22) Filed: Jun. 28, 2016

(65) Prior Publication Data

US 2017/0019213 A1 Jan. 19, 2017

(30) Foreign Application Priority Data

Jul. 17, 2015 (TW) .............................. 104123335 A

(51) Int. Cl.
*H04L 1/00* (2006.01)
*H04L 25/03* (2006.01)

(52) U.S. Cl.
CPC ...... *H04L 1/0055* (2013.01); *H04L 25/03171* (2013.01); *H04L 2025/03656* (2013.01)

(58) Field of Classification Search
CPC ....... H04L 1/004; H04L 1/0045; H04L 1/005; H04L 1/0051; H04L 1/0054; H04L 1/0055; H04L 1/0056; H04L 1/0057; H04L 1/0059; H04L 1/006; H04L 1/0061; H04L 1/0063; H04L 1/0064
USPC ................. 375/316, 341, 340, 324
See application file for complete search history.

(56) References Cited

U.S. PATENT DOCUMENTS

| 6,732,327 B1* | 5/2004 | Heinila | H03M 13/2957 714/786 |
| 8,799,737 B1* | 8/2014 | Varnica | H03M 13/6331 375/341 |
| 2007/0067703 A1* | 3/2007 | Berkmann | H03M 13/2975 714/794 |
| 2007/0220394 A1* | 9/2007 | Kim | H03M 13/2975 714/753 |

(Continued)

OTHER PUBLICATIONS

Taiwan Intellectual Property Office, "Office Action", issued on Jun. 27, 2016.

(Continued)

*Primary Examiner* — Siu Lee
(74) *Attorney, Agent, or Firm* — WPAT, PC; Justin King; Jonathan Chiang

(57) ABSTRACT

A decoding method applied to a convolutionally coded signal is provided. The method includes: adjusting first input information according to a first scaling factor to generate first a-priori information; b) decoding the convolutionally coded signal according to systematic information and the first a-priori information to generate first extrinsic information; c) adjusting second input information according to a second scaling factor to generate second a-priori information, wherein the second scaling factor is generated according to the first extrinsic information and the first a-priori information; and d) decoding the convolutionally coded signal according to the systematic information and the second a-priori information to generate second extrinsic information. One of step (b) and step (d) further generates a-posteriori information as a decoding result.

18 Claims, 3 Drawing Sheets

(56) References Cited

U.S. PATENT DOCUMENTS

2007/0286292 A1* 12/2007 Moelker ........... H03M 13/2957
375/241
2010/0208849 A1* 8/2010 Grosskinsky ....... B60C 23/0433
375/340
2012/0069936 A1* 3/2012 Shaver .................. H04L 1/0055
375/340
2016/0352361 A1* 12/2016 Fonseka ............ H03M 13/2906

OTHER PUBLICATIONS

Yi-Nan Lin; et al., "An Efficient Soft-Input Scaling Scheme for Turbo Decoding", 2006, IEEE.

* cited by examiner

DECODING METHOD USING DYNAMIC SCALER FACTOR

This application claims the benefit of Taiwan application Serial No. 104123335, filed Jul. 17, 2015, the subject matter of which is incorporated herein by reference.

BACKGROUND OF THE INVENTION

Field of the Invention

The invention relates in general to a communication system, and more particularly to a soft output decoder used in a receiver of convolutional communication.

Description of the Related Art

In the process of data transmission of a digital communication system, incorrect messages may be received at a receiver end frequently due to unpredictable interference. Without increasing the transmission power, channel coding, although effectively reduces the error rate, poses a setback of occupying the transmission bandwidth. In view of the increasing demand of data transmission and storage systems of the public, not only the transmission rate will get faster but also the quality of service (QoS) will get higher in the future. As channel coding ensures that an error of the transmission bit is controlled within a certain range, channel coding is a critical consideration in the system design.

Convolutional coding is often used in channel coding to prevent a receiver from receiving incorrect messages. At a transmitting end, a code vector or an information block transmitted may be described by a trellis diagram. The complexity of a trellis diagram is determined by a constraint length of an encoder. Although the operation complexity gets higher as the length of the constraint length gets longer, such coding relatively provides better robustness.

At a receiving end, a soft-decision decoder may be adopted to identify a maximum likelihood code vector through a Viterbi algorithm and trellis architecture to perform decoding. However, the operation complexity of the Viterbi algorithm exponentially increases as the constraint length gets longer. In other words, a Viterbi decoder may require a substantial amount of memory and consume significant power to decode the convolutional coding having a longer constraint length.

Turbo coding is proven to render better performance than common coding technologies. A turbo code is formed from processing two or more convolutional codes by a turbo interleaver. To decode turbo codes, convolutional codes are individually decoded by a soft-decision decoder using an iteration approach. A soft-decision decoder decodes a convolutional code to provide extrinsic information, which allows the soft-decision decoder to provide a more accurate result when the soft-decision decoder decodes another convolutional code. In the prior art, soft-decision decoding may adopt a maximum a-posterioriprobability (MAP) algorithm or a soft output Viterbi algorithm (SOVA), both of which requiring forward recursion and backward recursion for decoding to determine the soft output of one information block. In general, in an environment with a lower signal-to-noise ratio (SNR), turbo codes render better performance than other convolutional codes.

The computation amount of the MAP algorithm not only is huge and complicated, but also involves index calculation. Without special processing, decoding hardware requirement or time delay generated during the decoding process is often significantly increased.

SUMMARY OF THE INVENTION

According to an embodiment of the present invention, a decoding method applied to a convolutionally coded signal is provided. The method includes: adjusting first input information according to a first scaling factor to generate first a-priori information; b) decoding the convolutionally coded signal according to systematic information and the first a-priori information to generate first extrinsic information; c) adjusting second input information according to a second scaling factor to generate second a-priori information, wherein the second scaling factor is generated according to the first extrinsic information and the first a-priori information; and d) decoding the convolutionally coded signal according to the systematic information and the second a-priori information to generate second extrinsic information. One of step (b) and step (d) further generates a-posteriori information as a decoding result.

According to another embodiment of the present invention, a decoding apparatus applied to a convolutionally coded signal is provided. The decoding apparatus includes a first soft-in-soft-out (SISO) decoder, a second data converter, a second SISO decoder, a first data converter, a first scaling factor generator and a second scaling factor generator. The first SISO decoder decodes the convolutionally coded signal according to systematic information and first a-priori information to generate first extrinsic information. The second data converter converts the first extrinsic information to second a-priori information according to a second scaling factor. The second SISO decoder decodes the convolutionally coded signal according to the systematic information and the second a-priori information to generate second extrinsic information. The first scaling factor generator generates one of the first scaling factor and the second scaling factor according to the first a-priori information and the first extrinsic information. The second scaling factor generator generates the other of the first scaling factor and the second scaling factor according to the second a-priori information and the second extrinsic information. One of the first and second SISO decoders further generates a-posteriori information as a decoding result.

The above and other aspects of the invention will become better understood with regard to the following detailed description of the preferred but non-limiting embodiments. The following description is made with reference to the accompanying drawings.

DETAILED DESCRIPTION OF THE INVENTION

The present invention is capable of improving the converging speed of a soft-decision decoder in an iteration process. In a decoder according to embodiments of the present invention, a scaling factor is introduced for adjusting a-priori information generated from interleaving or de-interleavinga extrinsic information. The scaling factor is not a constantly value, but dynamically changes along with a result generated from previous iteration decoding and a previous value of the scaling factor.

Figure 1:
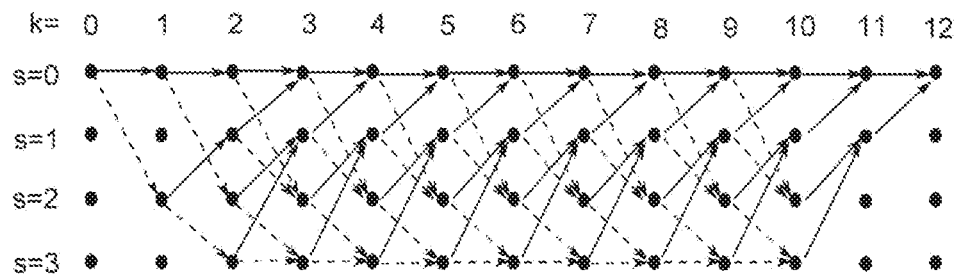
FIG. 1 shows a trellis.

In general, convolutional codes and turbo codes may be represented by a trellis, as shown in FIG. 1. The trellis in FIG. 1 includes 13 steps, each having four possible states to represent that the constraint length of an encoder is 2. In other words, block codes having a block code length of 12 are obtained from the trellis in FIG. 1. For illustration purposes, in the description below, k represents a block code length, which represents the number of steps that one block code includes. As known in the prior art, a MAP decoder adopts forward recursion and backward recursion on a trellis to generate a soft output. Based on received information, a MAP decoder minimizes the bit error probability of the decoding process.

Figure 2:
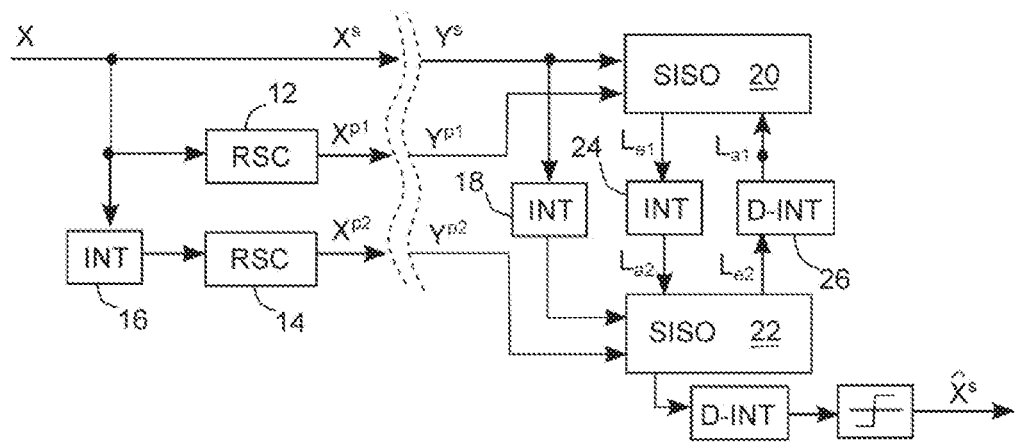
FIG. 2 shows a turbo encoder and a turbo decoder.

In FIG. 2, the left half shows a turbo encoder, and the right half shows a turbo decoder. A turbo encoder is generally formed by two parallel concatenated recursive systematic convolutional encoders RSC 12 and RSC 14, which are connected by an interleaver INT 16 in between. According to a block code X, the recursive systematic convolutional encoder RSC 12 generates a string of parity bits $x_k^{p1}$ that are in overall referred to as a parity code $X^{p1}$, where k=0 to K−1. Similarly, the recursive systematic convolutional encoder RSC 14 generates a parity code $X^{p2}$ (a string of parity bits $x_k^{p2}$) according to an interleaved block code X. The block code X is also referred as a systematic block code $X^s$. Bits in the systematic block code $X^s$, the parity code $X^{p1}$ and the parity code $X^{p2}$ may be interleavingly connected and be outputted to a communication channel through a multiplexer. To increase the code rate, a part of parity bits may be omitted and not outputted. For example, only a part of the parity bits $x_k^{p1}$ and $x_k^{p2}$ of the same step are outputted to a communication channel, such that the turbo encoder in FIG. 2 may have a higher code rate.

The turbo decoder in FIG. 2 calculates the reliability of the received information, and represents the reliability in form of log-likelihood ratios (LLRs). Each LLR represents the probability of one corresponding bit being 0 or 1. Compared to the systematic block code $X^s$, the parity code $X^{p1}$ and the parity code $X^{p2}$, the turbo decoder generates systematic information $Y^s$, parity information $Y^{p1}$ and parity information $Y^{p2}$. For example, the systematic information $Y^s$ is formed by a string of LLRs $y_k^s$, and the parity information $Y_p^1$ is formed by a string of LLRs $y_k^{p1}$, where k=0 to K−1. The turbo decoder in FIG. 2 includes interleavers INT 18 and 24, soft-input-soft-output (SISO) decoders SISO 20 and 22, and a de-interleaver 26. Operations and iteration details of these elements substantially follow a Bahl, Cocke, Jelinek and Raviv (BCJR) algorithm, also referred to as a MAP algorithm. According to the systematic information $Y^s$ and the parity information $Y^{p1}$ as well as a-priori information $L_{a1}$, the SISO 20 calculates a soft output (usually representing the maximum a-posteriori probability by an LLR), which is referred to as extrinsic information $L_{e1}$. After an interleaving process, the extrinsic information $L_{e1}$ becomes a-priori information $L_{a2}$. The SISO 22 calculates extrinsic information $L_{e2}$ according to the interleaved systematic information $Y^s$, the parity information $Y^{p2}$ and the a-priori information L. The extrinsic information $L_{e2}$ is processed by ande-interleaving process and becomes the a-priori information $L_{a1}$ that is then fed back to the SISO 20. The process having been performed once by the SISO 20 or 22 is referred to as half-iteration, and the computation process having been performed once by the SISO 20 and 22 is referred to as one iteration. In general, such iteration loop is repeated for a fixed number of times, or is repeated until the number of changing symbols in the extrinsic information $L_{e1}$ or $L_{e2}$ in the iteration loop is as small as a predetermined level. In FIG. 2, after the iteration loop repetition ends, the SISO 22 generates a-posteriori information, which is processed by de-interleaving and hard decision to serve as a decoding result $\hat{X}^s$. It should be noted that, FIG. 2 is not to be construed as a limitation to the present invention. For example, in another embodiment, after the iteration loop repetition ends, the SISO 20 may also generate another set of a-posteriori information, which may also serve as the decoding result $\hat{X}^s$ after having undergone hard decision.

Under the condition that the foregoing MAP algorithm calculates a received message Y, the probability of the message bit being digital 1 or 0 at a step k, or referred to as a-posteriori log-likelihood ratio L(uk|Y), is defined as below.

$$L(u_k/Y) = \ln \frac{P(u_k = +1/Y)}{P(u_k = -1/Y)}$$

The MAP algorithm calculates L(uk|Y) of each step k through forward and backward recursive operations on the trellis. L(uk|Y) is organized and represented as:

$$L(u_k/Y) = \ln \frac{\sum_{(n,m)\in u_k=1} \alpha_{k-1}(n)^* \gamma_k(n,m)^* \beta_k(m)}{\sum_{(n,m)\in u_k=-1} \alpha_{k-1}(n)^* \gamma_k(n,m)^* \beta_k(m)} \quad (1)$$

In equation (1), the branch metric $r_k(n,m)$ represents the probability of becoming a state m at the step k under conditions that the state is n at the step k−1 and the received message is Y, the forward state metric $\alpha_{k-1}(n)$ represents the probability that the state is n at the step k−1 under a condition that the received message is Y, the backward state metric $\beta_k(m)$ represents the probability that the state is m at the step k under a condition that the received message is Y. The alphabet zigma (Σ) of the numerator refers to a calculated total of all branches that possibly generate $u_k=1$. Similarly, the alphabet zigma (Σ) of the denominator refers to a calculated total of all branches that possibly generate $u_k=-1$. The forward state metric $\alpha_k(m)$, the backward state metric $\beta_k(m)$ and the branch metric $r_k(n,m)$ may be respectively represented as:

$$\alpha_k(m) = \sum_{n=1}^{M} \alpha_{k-1}(n)^* \gamma_k(n,m) \quad (2)$$

$$\beta_k(m) = \sum_{n=1}^{M} \beta_{k+1}(m)^* \gamma_{k+1}(n,m) \quad (3)$$

$$\gamma_k(n,m) = A_k P(m|n) \exp[2/N_0^*(y_k^s x_k^s(i) + y_k^p x_k^p(i,n,m))] \quad (4)$$

In the above, $A_k$ is a constant number, and i=+1 or −1. It is known from equation (2) that, to calculate the forward state metric $\alpha_k(m)$, the forward state metric α prior to the step k needs to be first learned; it is known from equation (3) that, to calculate the backward state metric $\beta_k(m)$, the backward state metric β subsequent to the step k needs to be first learned. Thus, the forward state metric $\alpha_k(m)$ and the backward state metric $\beta_k(m)$ are generally calculated and obtained through iteration, with however the directions of the iteration being opposite. It is known from equation (4) that, to calculate the branch metric $r_k(n,m)$ requires index and multiplication calculations, and consumes immense resources and costs regardless of whether it is implemented by hardware or software.

A Log-MAP algorithm simplifies the calculation process by using a logarithm quadrant operation. Further, the index and logarithm calculations may be simplified through the approximation method below.

$$\max^*(x,y) \equiv \ln(e^x + e^y) = \max(x,y) + \ln(1 + e^{-|y-x|}) \qquad (5)$$

The last logarithm calculation may be obtained through a look-up table. A Max-Log-MAP algorithm further removes the last item in equation (5) to approximate the operator max*, as below:

$$\max^*(x,y) = \ln(e^x + e^y) \approx \max(x,y) \qquad (6)$$

The decoding calculation in the SISOs 20 and 22 adopts the maximum a-posteriori probability (MAP) algorithm for decoding. The MAP algorithm may be the Log-MAP or Max-Log-MAP algorithm.

When using the Log-MAP or Max-Log-MAP algorithm for processing, equation (4) may be organized as:

$$\Gamma_k(n,m) = \ln(\gamma_k(n,m)) = 2/N_0 * (y_k^s x_k^s(i) + y_k^p x_k^p(i,n,m)) + \ln(P(m|n)) + K \qquad (7)$$

In equation (7), K is a constant value, and P(min) is input information transmitted from a first half iteration, e.g., a-priori information. Components of the input information exchanged between two half iterations may be slightly adjusted, e.g., multiplying by a scaling factor $s_d$ to increase the converging speed of the iteration loop of the turbo decoder. Wherein, d is 1 or 2, which respectively correspond to the SISO 20 and 22, i.e., the first and second half iterations.

The scaling factor $s_d$ may be set as a fixed value, e.g., 0.7. However, it usually may be challenging to select a most appropriate fixed value.

Figure 3:
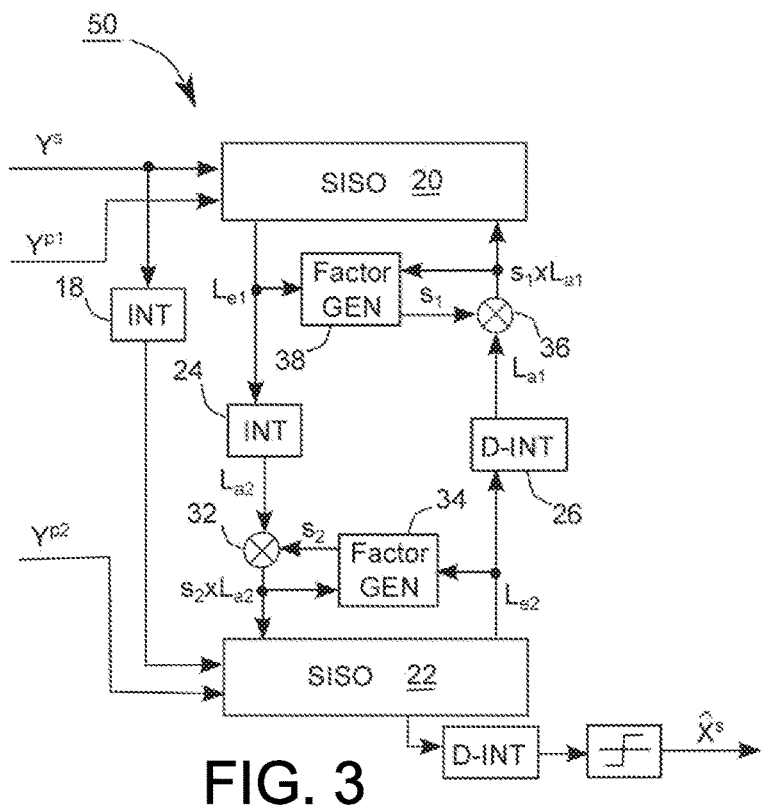
FIG. 3 and FIG. 4 are two turbo decoders according to embodiments of the present invention.

FIG. 3 shows a turbo decoder 50 according to an embodiment of the present invention. Scaling factors $s_1$ and $s_2$ adopted are not fixed values, but are dynamically updated as the iteration loop progresses. Distinct from the turbo decoder in FIG. 2, the turbo decoder 50 additionally includes scaling factor generators 38 and 34, and multipliers 36 and 32. The scaling factor generator 38 provides the scaling factor $s_1$ to the multiplier 36, adjusts a-priori information $L_{a1}$ to generate $s_1 \times L_{a1}$ as new a-priori information of the SISO 20. The SISO 20 generates extrinsic information $L_{e1}$ after completing half iteration. At this point, according to the extrinsic information $L_{e1}$, the a-priori information $s_1 \times L_{a1}$ and a predetermined equation, the scaling factor generator 38 identifies the new scaling factor $s_1$ to be adopted in subsequent iteration loop. The scaling factor generator 34 and the multiplier 32 are used in the other half iteration, and associated operations and principles may be learned from the operations and principles of the scaling factor generator 38 and the multiplier 36 and shall be omitted herein.

In one embodiment of the present invention, for example, the scaling factor generators 38 and 34 generate $s_1$ and $s_2$ according to equations (8a) and (8b), respectively:

$$s_1(I+1) = s_1(I) + \text{STEP} * \text{DIF}_1(I)/\text{LEN} \qquad (8a)$$

$$s_2(I+1) = s_2(I) + \text{STEP} * \text{DIF}_2(I)/\text{LEN} \qquad (8b)$$

In the equations above, STEP represents a constant number and may be pre-set according to requirements, and $s_1(I)$ represents the scaling factor adopted in the $1^{st}$ half iteration in the $I^{th}$ iteration loop. The variance $\text{DIF}_1(I)$ is a sum of different numbers of bits between the extrinsic information $L_{e1}$ generated by the first half iteration of the $I^{th}$ iteration loop and the a-priori information $L_{a1}$ generated by the second half iteration of the $(I-1)^{th}$ iteration loop. That is, The variance $\text{DIF}_1(I)$ may be learned from the a-priori information $L_{a1}$ and the extrinsic information $L_{e1}$ of the same half iteration. For example, after the first half iteration of the $2^{nd}$ iteration loop, there is a difference of 3 bits between the extrinsic information $L_{e1}$ and t the a-priori information $L_{a1}$, and so the variance $\text{DIF}_1(2)$ is 3. LEN is a constant number associated with the code block length K. In one embodiment, LEN is directly equal to the block code length K, e.g., 2080. In another embodiment, the relationship between LEN and the block code length K is LEN=K*bit/step, where bit is information bit, and bit/step is the possible number outputted in each step. In one embodiment K=2080, bit/step=2, and LEN=4160.

$s_2(I)$ and the variance $\text{DIF}_2(I)$ respectively represent the scaling factor adopted in the second half iteration of the $I^{th}$ iteration loop, and the variance generated after the decoding of the second half iteration of the $I^{th}$ iteration loop.

In some embodiments, initial values $s_1(0)$ and $s_2(0)$ of the scaling factors are both set to 0.25. In some embodiments, the scaling factors $s_1$ and $s_2$ are limited to a maximum value 1. In other words, if the scaling factors $s_1$ and $s_2$ obtained from equations (8a) and (8b) exceed 1, the scaling factors $s_1$ and $s_2$ are set to 1.

It is discovered from equations (8a) and (8b) that, the scaling factor adopted in the specific half iteration is determined by the scaling factor and the decoding result of the same specific half iteration of a previous iteration loop. Further, if the variance $\text{DIF}_d(I)$ generated by the previous iteration loop is not 0, the scaling factor adopted in the current iteration loop is then larger than the scaling factor adopted in the previous iteration loop. It is further discovered from equations (8a) and (8b) that, the scaling factors $s_1$ and $s_2$ used in each iteration loop are not smaller than the scaling factors $s_1$ and $s_2$ used in the previous iteration loop.

It is proven through computerized simulations that, the scaling factors adopting equations (8a) and (8b) are capable of causing the iteration loop to converge quickly, i.e., quickly reducing the variance $\text{DIF}_d(I)$. Thus, the decoding efficiency of the turbo decoder can be enhanced.

Figure 4:
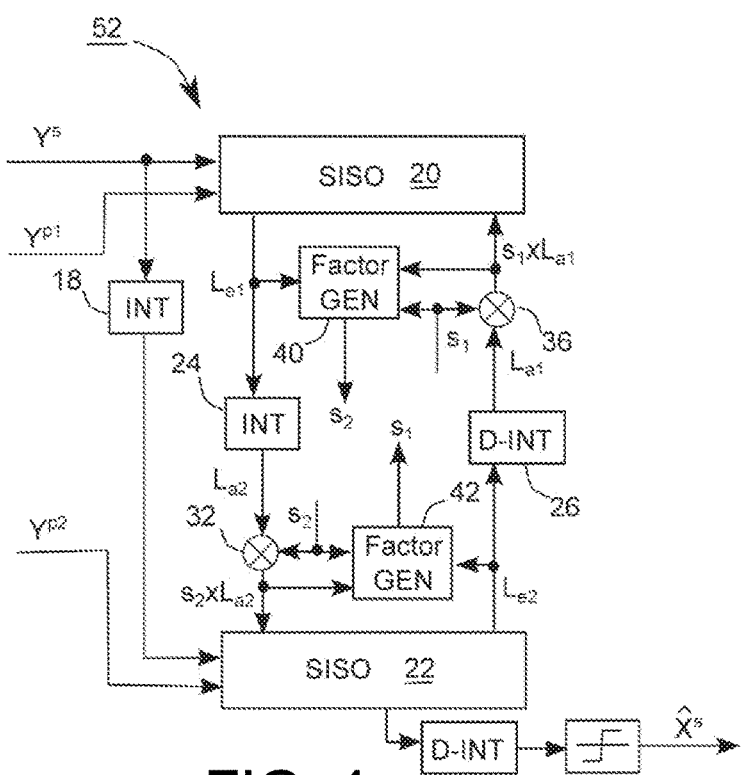

FIG. 4 shows a turbo decoder 52 according to another embodiment of the present invention. In this embodiment, scaling factor generators 40 and 42 generate scaling factors $s_1$ and $s_2$ according to calculations of equations (9a) and (9b), respectively:

$$s_2(I) = s_1(I) + \text{STEP} * \text{DIF}_1(I)/\text{LEN} \qquad (9a)$$

$$s_1(I+1) = s_2(I) + \text{STEP} * \text{DIF}_2(I)/\text{LEN} \qquad (9b)$$

Figure 5:
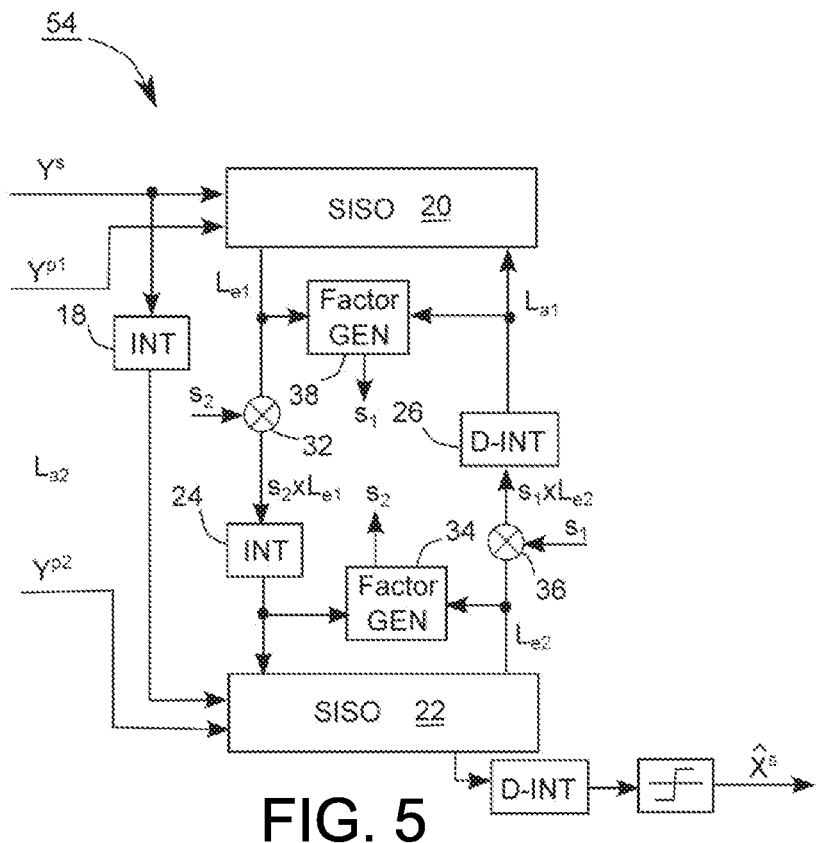
FIG. 5 and FIG. 6 are another two turbo decoders according to embodiments of the present invention.
Figure 6:
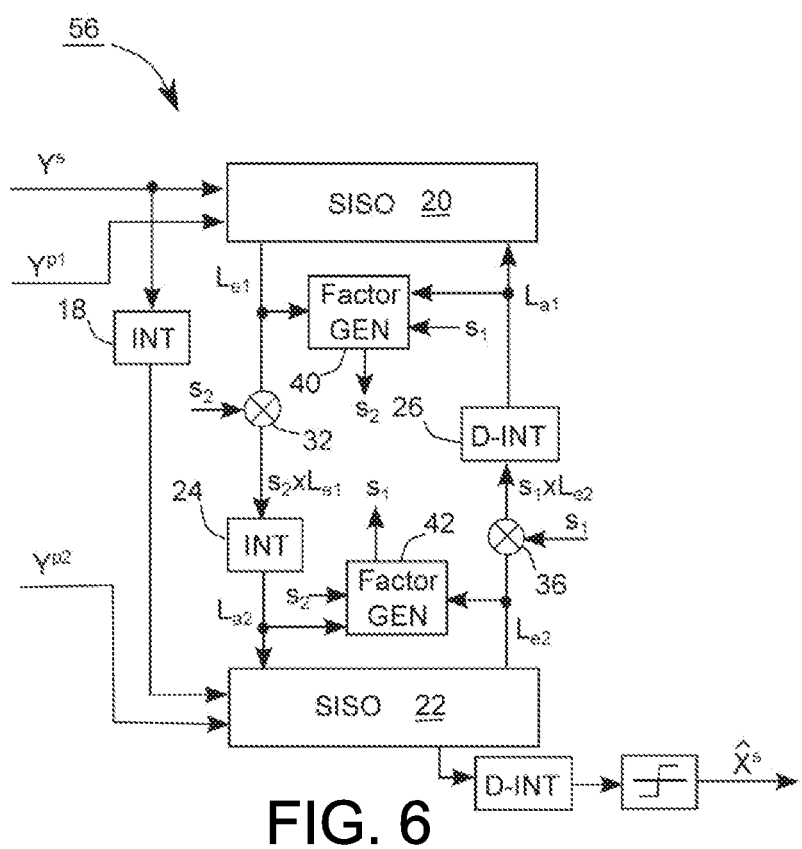

The scaling factors in FIG. 3 and FIG. 4 are for adjusting the a-priori information as a non-limiting example of the present invention. For example, referring to FIG. 5 and FIG. 6 showing two turbo decoders 54 and 56 according to embodiments of the present invention, the scaling factors are for adjusting the extrinsic information. It should be noted that, adjusting the exchange input information between two SISOs using scaling factors is encompassed within the scope of the present invention.

FIG. 5 is similar to FIG. 3, and similar or identical details are omitted herein. In FIG. 5, the scaling factor generators 38 and 34 generate $s_1$ and $s_2$ according to calculations of equations (8a) and (8b), respectively. In FIG. 5, the multiplier 36 multiplies the extrinsic information $L_{e2}$ generated by the SISO 22 by the scaling factor $s_1$ to generate $s_1 \times L_{e2}$ to the de-interleaver 26. Similarly, the multiplier 32 multiplies the extrinsic information $L_{e1}$ generated by the SISO 20 by the scaling factor $s_2$ to generate $s_2 \times L_{e1}$ to the interleaver 24.

FIG. 6 is similar to FIG. 4, and similar or identical details are omitted herein. In FIG. 6, the scaling factor generators 40 and 42 generate $s_1$ and $s_2$ according to calculations of equations (9a) and (9b), respectively. In FIG. 6, the multiplier 36 multiplies the extrinsic information $L_{e2}$ generated by the SISO 22 by the scaling factor $s_1$ to generate $s_1 \times L_{e2}$ to the de-interleaver 26. Similarly, the multiplier 32 multiplies the extrinsic information $L_{e1}$ generated by the SISO 20 by the scaling factor $s_2$ to generate $s_2 \times L_{e1}$ to the interleaver 24.

In FIG. 3 and FIG. 5, the scaling factor generators 38 and 34 generate the scaling factors $s_1$ and $s_2$ according to the calculations of equations (8a) and (8b), respectively. For example but not limited to, each time the scaling factor is adjusted, the scaling factor used by the same half iteration in the previous iteration loop is referred. In another embodiment, the scaling factor generators 38 and 34 generate the scaling factors $s_1$ and $s_2$ according to the calculations of equations (10a) and (10b), respectively. In equations (10a) and (10b), each time the scaling factor is adjusted, the scaling factor used by the previous half iteration is referred.

$$s_1(I+1)=s_2(I)+\text{STEP}*\text{DIF}_1(I)/\text{LEN} \qquad (10a)$$

$$s_2(I)=s_1(I)+\text{STEP}*\text{DIF}_2(I)/\text{LEN} \qquad (10b)$$

In FIG. 4 and FIG. 6, the scaling factors 40 and 42 generate the scaling factors $s_1$ and $s_2$ according to the calculations of equations (9a) and (9b), respectively. For example but not limited to, each time the scaling factor is adjusted, the scaling factor used by the previous half iterationis referred. In another embodiment, the scaling factor generators 40 and 42 in FIG. 4 and FIG. 6 generate the scaling factors $s_1$ and $s_2$ according to the calculations of equations (11a) and (11b), respectively. In equations (11a) and (11b), each time the scaling factor is adjusted, the scaling factor used by the same half iteration in the previous iteration loop is referred.

$$s_2(I+1)=s_2(I)+\text{STEP}*\text{DIF}_1(I)/\text{LEN} \qquad (11a)$$

$$s_1(I+1)=s_1(I)+\text{STEP}*\text{DIF}_2(I)/\text{LEN} \qquad (11b)$$

In simple, each time the scaling factor is adjusted, the scaling factor used by the same half iteration in the previous iteration loop or the scaling factor used by the previous half iteration may be referred. Each time the scaling factor is adjusted, the variance generated by the same half iteration in the previous iteration loop or the variance generated by the previous half iteration may be referred. Thus, there are at least four combinations, which are encompassed within the scope of the present invention.

After the iteration loop repetition is complete, a-posteriori information is generated by the SISO 22 in FIG. 3 to FIG. 6. The a-posteriori information is processed by de-interleaving and hard decision to serve as a decoding result $\hat{X}^S$. In other embodiments, another set of a-posteriori information may also be generated by the SISO 20, and is processed by hard decision to serve as the decoding result $\hat{X}^S$.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding method applied to a convolutionally coded signal, comprising:
   a) adjusting first input information according to a first scaling factor to generate first a-priori information;
   b) decoding the convolutionally coded signal according to systematic information and the first a-priori information to generate first extrinsic information;
   c) adjusting second input information according to a second scaling factor to generate second a-priori information, wherein the second scaling factor is calculated based on the first extrinsic information and the first a-priori information; and
   d) decoding the convolutionally coded signal according to the systematic information and the second a-priori information to generate second extrinsic information;
   wherein, one of step (b) and step (d) further generates a-posteriori information as a decoding result.

2. The method according to claim 1, decoding the convolutionally coded signal by an iteration loop method, each iteration loop comprising:
   a1) performing a first half iteration; and
   b1) performing a second half iteration;
   wherein, the step of generating the first a-priori information and the step of generating the first extrinsic information are the first half iteration; and
   the step of generating the second a-priori information and the step of generating the second extrinsic information are the second half iteration.

3. The decoding method according to claim 2, wherein the second scaling factor is calculated based on the first scaling factor.

4. The decoding method according to claim 2, wherein the second scaling factor is calculated based on a previous second scaling factor.

5. The decoding method according to claim 1, decoding the convolutionally coded signal by an iteration loop method, each iteration loop comprising:
   a1) performing a first half iteration; and
   b1) performing a second half iteration;
   wherein, the step of generating the first a-priori information and the step of generating the first extrinsic information are the first half iteration of an Nth iteration loop; and
   the step of generating the second a-priori information and the step of generating the second extrinsic information are the first half iteration of an (N+1)th iteration loop.

6. The decoding method according to claim 5, wherein the second scaling factor is generated according to the first scaling factor.

7. The decoding method according to claim 5, wherein the second scaling factor is generated according to a previous scaling factor of the second half iteration of the Nth iteration loop.

8. The decoding method according to claim 1, wherein the step of adjusting the first input information according to the first scaling factor to generate the first a-priori information comprises:
   interleaving the adjusted first input information to generate the first a-priori information, wherein the first input information is extrinsic information.

9. The decoding method according to claim 1, wherein the first input information is extrinsic information having undergone interleaving.

10. The decoding method according to claim 1, wherein the second scaling factor is greater than or equal to the first scaling factor.

11. The decoding method according to claim 1, wherein the second scaling factor is limited to be smaller than or equal to a predetermined value.

12. The decoding method according to claim 1, wherein the first a-priori information and the first extrinsic information determine a variance, and the second scaling factor is generated according to the variance and the first scaling factor.

13. The decoding method according to claim 1, wherein the convolutionally coded signal comprises a block code length, and the second scaling factor is generated further according to the block code length.

14. A decoding apparatus applied to a convolutionally coded signal, comprising:
- a first soft-in-soft-out (SISO) decoder, decoding the convolutionally coded signal according to systematic information and first a-priori information to generate first extrinsic information;
- a second data converter, converting the first extrinsic information to second a-priori information according to a second scaling factor;
- a second SISO decoder, decoding the convolutionally coded signal according to the systematic information and the second a-priori information to generate second extrinsic information;
- a first data converter, converting the second extrinsic information to the first a-priori information according a first scaling factor;
- a first scaling factor generator, calculating one of the first scaling factor and the second scaling factor according to the first a-priori information and the first extrinsic information; and
- a second scaling factor generator, calculating the other of the first scaling factor and the second scaling factor according to the second a-priori information and the second extrinsic information;
- wherein, one of the first and second SISOs further generates a-posteriori information as a decoding result.

15. The decoding apparatus according to claim 14, wherein the first data converter comprises a first multiplier and a de-interleaver connected in series, and the first multiplier is controlled by the first scaling factor; and the second data converter comprises a second multiplier and an interleaver connected in series, and the second multiplier is controlled by the second scaling factor.

16. The decoding apparatus according to claim 15, wherein the first multiplier receives an output of the de-interleaver.

17. The decoding apparatus according to claim 15, wherein the de-interleaver receives an output of the first multiplier.

18. The decoding apparatus according to claim 14, wherein the first a-priori information and the first extrinsic information determine a variance, and the first scaling factor generator provides one of the first scaling factor and the second scaling factor according to the variance.

* * * * *